(12) United States Patent
Yamanaka et al.

(10) Patent No.: US 9,160,087 B2
(45) Date of Patent: Oct. 13, 2015

(54) BOARD CONNECTING TERMINAL

(71) Applicant: YAZAKI CORPORATION, Tokyo (JP)

(72) Inventors: Hideki Yamanaka, Shizuoka (JP);
Hiromi Watanabe, Kanagawa (JP)

(73) Assignee: YAZAKI CORPORATION, Tokyo (JP)

( * ) Notice: Subject to any disclaimer, the term of this patent is extended or adjusted under 35 U.S.C. 154(b) by 67 days.

(21) Appl. No.: 13/899,799

(22) Filed: May 22, 2013

(65) Prior Publication Data

US 2013/0260579 A1  Oct. 3, 2013

Related U.S. Application Data

(63) Continuation of application No. PCT/JP2012/051134, filed on Jan. 13, 2012.

(30) Foreign Application Priority Data

Jan. 14, 2011  (JP) .................. 2011-006060

(51) Int. Cl.
*H01R 12/55* (2011.01)
*H01R 12/57* (2011.01)
(Continued)

(52) U.S. Cl.
CPC ............... *H01R 12/57* (2013.01); *H01R 12/55* (2013.01); *H01R 12/724* (2013.01); *H05K 3/3405* (2013.01); *H05K 3/3447* (2013.01); *H05K 2201/09145* (2013.01); *H05K 2201/1034* (2013.01)

(58) Field of Classification Search
CPC ...... H01R 12/57; H01R 12/58; H01R 12/585; H01R 12/728; H01R 23/727

USPC ............................ 439/78, 81, 83, 92, 95, 861
See application file for complete search history.

(56) References Cited

U.S. PATENT DOCUMENTS

| | | | |
|---|---|---|---|
| 4,037,898 A | 7/1977 | Guyette | |
| 4,299,436 A * | 11/1981 | Ackerman | ............ 439/853 |
| 4,332,430 A * | 6/1982 | Clark | ............ 439/83 |

(Continued)

FOREIGN PATENT DOCUMENTS

| | | |
|---|---|---|
| CN | 1543013 A | 11/2004 |
| DE | 1 867 468 U | 2/1963 |

(Continued)

OTHER PUBLICATIONS

International Search Report and Written Opinion of the International Search Report for PCT/JP2012/051134 dated Mar. 20, 2012.

(Continued)

*Primary Examiner* — James Harvey
(74) *Attorney, Agent, or Firm* — Kenealy Vaidya LLP

(57) ABSTRACT

A board connecting terminal includes a contact which comes into contact with a mate side terminal, and a solder part soldered to a pad part formed in a circuit board and connected to the contact. The solder part includes a solder part main body soldered to the pad part, a first engaging piece extended from the solder part main body and a second engaging piece extended from the solder part main body. The solder part main body is soldered to the pad part under a state that the first engaging piece and the second engaging piece are engaged with the circuit board.

6 Claims, 10 Drawing Sheets

(51) Int. Cl.
*H01R 12/72* (2011.01)
*H05K 3/34* (2006.01)

(56) References Cited

U.S. PATENT DOCUMENTS

| | | | |
|---|---|---|---|
| 4,979,903 | A | 12/1990 | Gosselin |
| 5,641,300 | A * | 6/1997 | Corrion ..................... 439/352 |
| 5,945,637 | A | 8/1999 | Katsumata et al. |
| 6,077,095 | A * | 6/2000 | DelPrete et al. ............. 439/92 |
| 6,172,308 | B1 | 1/2001 | Katsumata et al. |
| 2002/0002012 | A1 | 1/2002 | Torii |
| 2004/0214480 | A1 | 10/2004 | Kitajima |
| 2013/0260579 | A1 * | 10/2013 | Yamanaka et al. ............ 439/83 |

FOREIGN PATENT DOCUMENTS

| | | |
|---|---|---|
| EP | 0 367 350 A1 | 5/1990 |
| GB | 2 287 586 A | 9/1995 |
| JP | 58-14682 U | 1/1983 |
| JP | 63-96775 U | 6/1988 |
| JP | 1-98479 U | 6/1989 |
| JP | 2-18273 A | 1/1990 |
| JP | 9-259950 A | 10/1997 |
| JP | 2000-182694 A | 6/2000 |
| JP | 2004-319630 A | 11/2004 |

OTHER PUBLICATIONS

Japanese Office Action for the related Japanese Patent Application No. 2011-006060 dated Sep. 30, 2014.
Korean Office Action for the related Korean Patent Application No. 10-2013-7018136 dated Sep. 30, 2014.
Chinese Office Action for the related Chinese Patent Application No. 201280005429.9 dated Jan. 7, 2015.

* cited by examiner

BOARD CONNECTING TERMINAL

CROSS REFERENCE TO RELATED APPLICATION

This application is a continuation of PCT application No. PCT/JP2012/051134, which was filed on Jan. 13, 2012 based on Japanese Patent Applications No. 2011-006060 filed on Jan. 14, 2011, the contents of which are incorporated herein by reference.

TECHNICAL FIELD

The present invention relates to a board connecting terminal directly attached to a circuit board and connected to a connector terminal of a mate side connector.

BACKGROUND ART

Usually, a connector for connecting a board is proposed that connects a terminal attached to a connector housing to a pad part on a circuit board (for instance, see JP-A-2000-182694). The connector 1 for connecting the board includes, as shown in FIG. 14, an upward male connector housing (a connector housing) 2 made of a synthetic resin, terminals 3 protruding downward from the male connector housing 2 and having curved resilient contact parts 4 in their end sides and a pair of attaching parts (brackets) 7 and 7 provided both sides of the male connector housing 2 and having semispherical engaging protrusions to which a circuit board 6 is inserted and engaged.

The male connector housing 2 is formed so as to be divided into an upper part and a lower part. In an upper housing part 2a, a plurality of terminal accommodating chambers 8 are provided upward. In a lower housing part 2b, the terminals 3 are fixed by means of, for instance, an insert molding under a state that the lower half parts of the terminals 3 protrude. In the terminal accommodating chambers 8, female type electric contact parts (not shown in the drawing) as the upper half parts of the terminals 3 are accommodated. Further, in both side walls 9 of the lower housing part 2b, the attaching parts 7 are integrally formed to protrude.

The lower half part of the terminal 3 includes a vertically extending flat plate shaped straight part 10, a horizontally short support part 11 bent at right angles to a detaching direction of the circuit board 6 from a lower end of the straight part 10 to form a stepped part and a resilient contact part 4 protruding downward from a front end of the support part 11 and curved in a circular arc shape substantially in the shape of U or substantially in the shape of J (either may be used). The support part 11 may be resiliently bent when a strong pressing force is applied upward thereto and serves to improve a flexural rigidity of the resilient contact part 4.

The resilient contact part 4 can come into linear contact or planar contact with an electrically conductive pad part 13 (a part of a circuit 12) continuous to a printed circuit 12 or an electric wire (either may be used, refer it to as a circuit, hereinafter). The direction of a linear contact is a direction orthogonal to an inserting direction (a direction shown by an arrow mark a) of the circuit board 6. The curved resilient contact part 4 can be resiliently bent in such a direction as to enlarge a diameter.

The resilient contact part 4 of this example includes a front side guide inclined part inclined somewhat forward, a circular arc shaped contact surface part continuous to the guide inclined part and a base part rising vertically from the contact surface part and continuous to the support part 11.

In the connector for connecting the board having such a structure, the circuit board 6 is slid in the direction shown by the arrow mark a to be engaged with the one pair of attaching parts 7 and 7, so that the resilient contact part 4 of the terminal 3 can be allowed to come into resilient contact with the pad part 13 of the circuit 12. Therefore, the resilient contact part 4 is pressed to an upper surface of the pad part 13 by a strong contact pressure. Accordingly, the terminal 3 can be simply, assuredly and stably connected to the circuit 12 to improve an attaching workability.

The connector 1 for connecting the board has a structure in which the terminals 3 are respectively aligned and formed so that each of the terminals 3 is accommodated and fixed in each of the terminal accommodating chambers 8 formed in the male connector housing 2. Accordingly, a pitch accuracy of each terminal 3 is held so that the terminals 3 respectively correspond to the arrangement of the plurality of pad parts 13 on the circuit board 6, and the terminals 3 may respectively hold strength to an external force received during an attachment and detachment of a mate side connector housing at the same time.

SUMMARY OF THE INVENTION

The above-described usual connector for connecting the board has below-described problems to be solved. Namely, in order to ensure the pitch accuracy of each terminal and obtain the strength to the external force during the attachment and detachment relative to a terminal of the mate side connector housing, the connector housing is necessary for aligning and fixing the terminals. Accordingly, not only an occupied space where the connector housing is installed is large, but also a cost is increased as the connector substantially as a result of the above-described fact. The connector housing 2 is made of the synthetic resin. In the connector for connecting the board of a type that the terminal is directly soldered to the pad part 13, since a highly heat resistant resin needs to be used, the increase of the cost cannot be avoided.

The present invention is devised by considering the above-described circumstances, and it is an object of the present invention to provide a board connecting terminal in which the use of a connector housing having terminal accommodating chambers can be saved, and even when the use of the connector housing is saved, terminals can be aligned and fixed on a circuit board without generating the deformation or movement of the terminals to an external force during an attachment and detachment of terminals of a mate side connector and the terminals can be more sufficiently aligned and fixed by a connection through a solder.

In order to achieve the above-described object, a board connecting terminal according to the present invention is characterized by below-described (1) to (8).

(1) A board connecting terminal including:
a contact which comes into contact with a mate side terminal and a solder part soldered to a pad part formed in a circuit board and connected to the contact, wherein the solder part includes a solder part main body soldered to the pad part, a first engaging piece extended from the solder part main body and a second engaging piece extended from the solder part main body, and the solder part main body is soldered to the pad part under a state that the first engaging piece and the second engaging piece are engaged with the circuit board.

(2) A board connecting terminal having the structure of the above-described (1), wherein either the first engaging piece or the second engaging piece or both the first engaging piece and the second engaging piece is engaged with an engaging hole bored in a surface of the circuit board on which the pad part is formed or a cut-out part formed in an end part of the circuit board.

(3) A board connecting terminal having the structure of the above-described (2), wherein in either the first engaging piece or the second engaging piece or both the first engaging piece and the second engaging piece, an engaging pawl is formed which is engaged with the engaging hole or the cut-out part.

(4) A board connecting terminal having any one of the structures of the above-described (1) to (3), wherein the solder part main body is located so as to be sandwiched between the first engaging piece and the second engaging piece and is bent so as to protrude to the circuit board.

(5) A board connecting terminal having the structure of the above-described (1), wherein the second engaging piece connects the solder part main body to the contact and is engaged with the cut-out part formed in the end part of the circuit board so that the contact is located in a position lower than that of the solder part main body in the direction of thickness of the circuit board.

(6) A board connecting terminal having the structure of the above-described (5), wherein a distance that the contact is separated from the solder part main body in the direction of thickness of the circuit board is set to a distance within the thickness of the circuit board.

(7) A board connecting terminal having any one of the structure of the above-described (1) to (6), wherein the solder part main body has a form of a plate extending in the longitudinal direction of the contact.

(8) A board connecting terminal having the structure of the above-described (7), wherein the first engaging piece and the second engaging piece are respectively extended in the end parts of the solder part main body having the plate shape in the transverse direction.

According to the board connecting terminal having the structure of the above-described (1), when the first engaging piece and the second engaging piece extended in the solder part main body are engaged with the circuit board, the solder part can be held on the pad part on the circuit board. Further, when the solder part main body is soldered to the pad part, the solder part can be aligned and fixed to a holding position on the circuit board by holding a prescribed strength. Accordingly, even when the contact connected to an end part of the solder part main body receives an external force due to an attachment and detachment of a terminal of a mate side connector, the contact is not deformed, nor the contact is moved. As a result, a plurality of board terminals are stably held on the circuit board under an aligned state. Further, since the usual connector housing is not necessary to align, arrange and fix the plurality of board connecting terminals, a cost of the board connecting terminal and a connector for connecting a board can be extremely reduced.

According to the board connecting terminal having the structure of the above-described (2), since the solder part main body forming each of the board connecting terminals is positioned so as to face the pad part on the circuit board and held so as not to move from the position, the solder part main body can be assuredly soldered to the pad part.

According to the board connecting terminal having the structure of the above-described (3), the solder part main body positioned so as to face the pad part on the circuit board can be stably held so that the solder part main body does not move and does not shake on the circuit board.

According to the board connecting terminal having the structure of the above-described (4), since the engaging pawl is engaged with the cut-out part so as to bite at it, the solder part main body positioned so as to face the pad part on the circuit board assuredly comes into contact with the pad part on the circuit board with a sufficient contact surface thereon. Thus, the solder part main body can be sufficiently and assuredly soldered to the pad part.

According to the board connecting terminal having the structure of the above-described (5), the second engaging piece faces a cut-out surface of the cut-out part. Even when the contact receives an external force in a direction (a pushing-in direction) of the cut-out surface during the attachment and detachment of the mate side connector, the second engaging piece does not collapse due to the contact with the cut-out surface. Further, even when the contact receives an external force in a stretching direction due to the attachment and detachment of the mate side connector, since the second engaging piece is engaged with the cut-out surface, the second engaging piece does not fall down in the stretching direction.

According to the board connecting terminal having the structure of the above-described (6), since the second engaging piece assuredly faces the cut-out surface of the cut-out part, when the contact receives an external force exerted to a direction of the cut-out part (a compressing direction) due to the attachment and detachment of the mate side connector, the second engaging piece can be more assuredly avoided from falling down in the direction of the cut-out part.

According to the board connecting terminal having the structure of the above-described (7), an area where the solder part main body faces the pad part can be sufficiently ensured and a solder bonding strength of the solder part main body and the pad part by soldering can be more improved.

According to the board connecting terminal having the structure of the above-described (8), the solder part main body and the contact can be assuredly avoided from moving in a direction along surfaces thereof or shaking during the attachment and detachment of the mate side connector.

According to the board connecting terminal of the present invention, since the use of the connector housing for aligning and holding the terminals is saved, a size can be made to be compact and the cost can be decreased as the connector for connecting the board, the contacts are not deformed, nor the contacts are moved by receiving the external force during the attachment and detachment of the mate side connector and the board connecting terminals can be aligned and fixed so as to face parts just above the pad parts on the circuit board.

In the above description, the present invention is briefly explained. Further, when the description of embodiments that will be described below will be read by referring to the attached drawings, a detail of the present invention will be more clarified.

BRIEF DESCRIPTION OF THE DRAWINGS

FIGS. 8A to 8C are plan views respectively showing the modified examples.

DETAILED DESCRIPTION OF THE EXEMPLARY EMBODIMENTS

Figure 1:
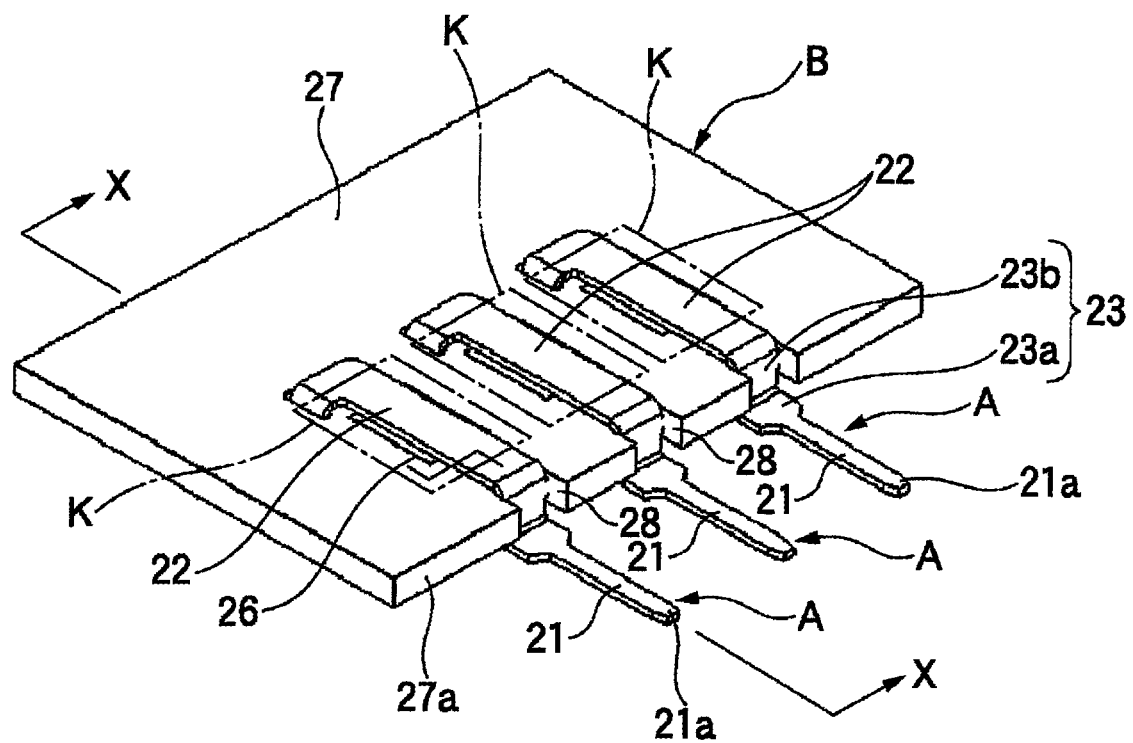
FIG. 1 is a perspective view showing a connector for connecting a board having a board connecting terminal according to an exemplary embodiment of the present invention.
Figure 2:
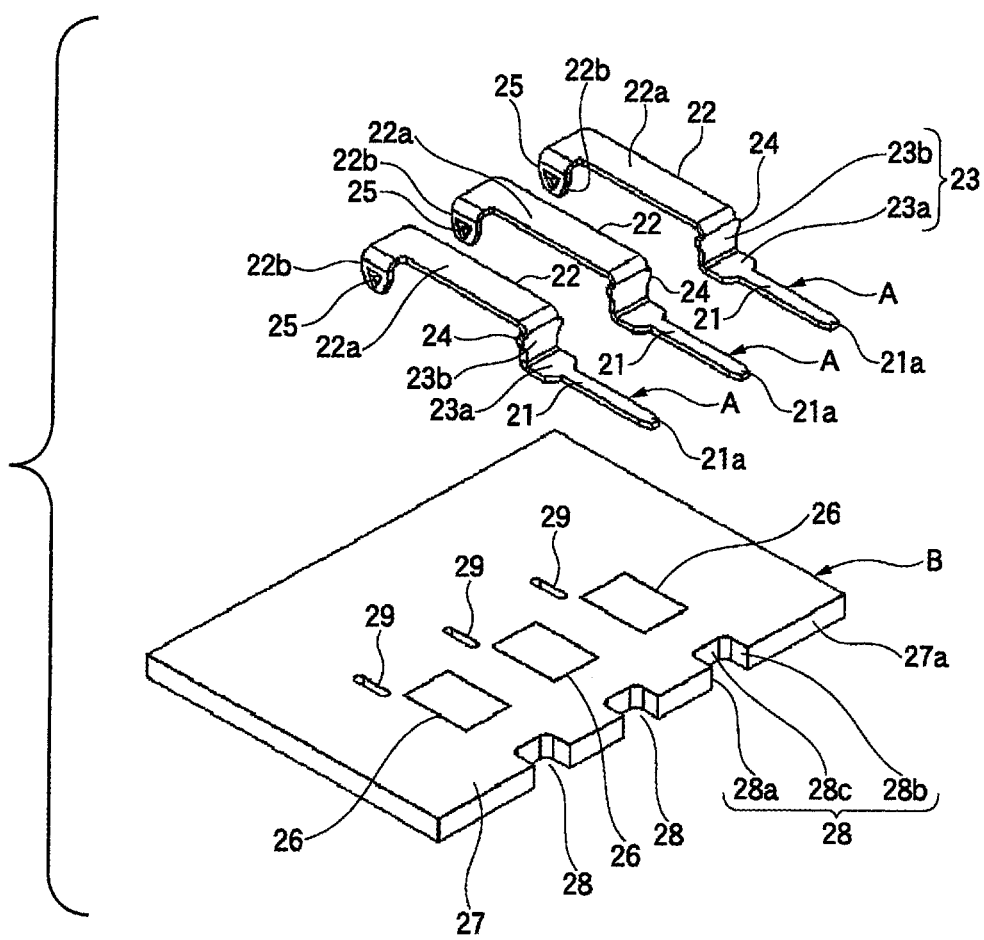
FIG. 2 is an exploded perspective view of the connector for connecting the board shown in FIG. 1.
Figure 3:
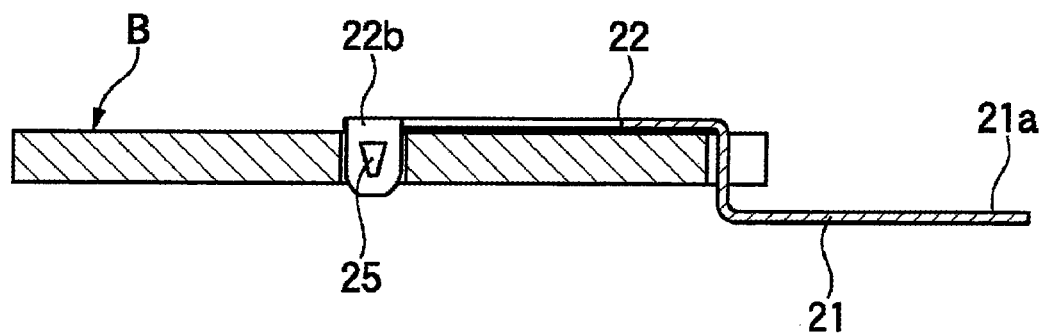
FIG. 3 is a longitudinally sectional view taken along a line X-X in FIG. 1.
Figure 4:
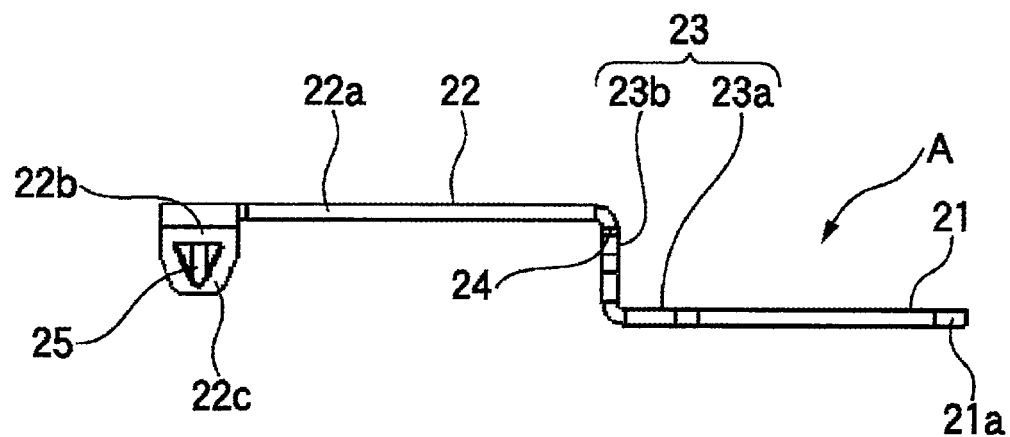
FIG. 4 is a front view showing the board connecting terminal shown in FIG. 2.
Figure 5:
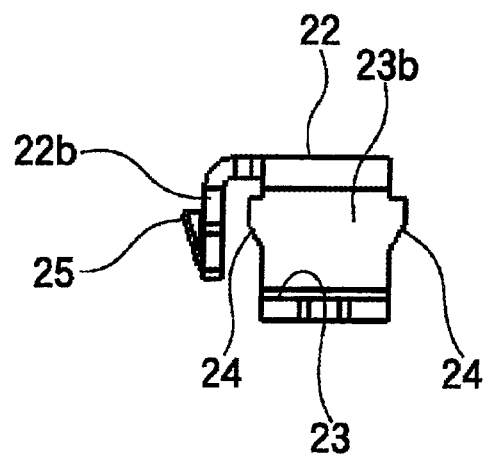
FIG. 5 is a right side view showing the board connecting terminal shown in FIG. 2.
Figure 6:
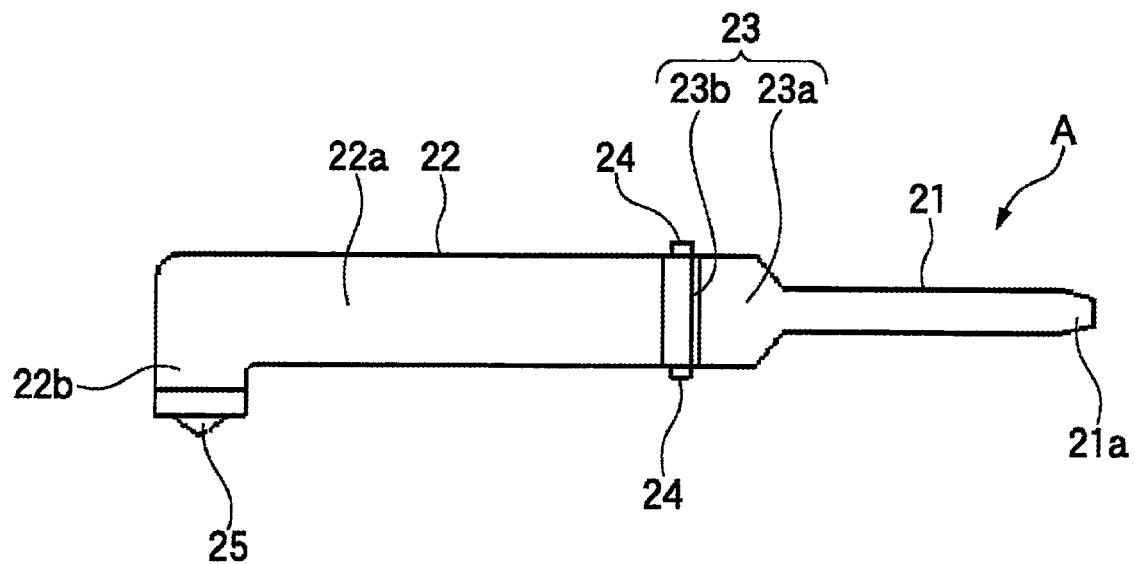
FIG. 6 is a plan view showing the board connecting terminal shown in FIG. 2.

Now, a board connecting terminal according to one exemplary embodiment of the present invention will be described below by referring to FIG. 1 to FIG. 3.

The board connecting terminal A of the one exemplary embodiment shown in FIG. 1 to FIG. 8 is attached to a circuit board B to form a connector for connecting a board. In the board connecting terminal A, a contact 21 and a solder part 22 are formed by press working an electrically conductive plate. The contact (a male terminal) 21 thereof is connected to a terminal (not shown in the drawing) of a mate side connector to transmit and receive an electric signal. The solder part 22 is soldered to a pad part formed on an upper surface of the circuit board B.

The contact 21 is thin so that its width is set to, for instance, about ⅓ to ¼ times as thin as the width of the solder part 22. An end part is set as an end part 21a both side edges of which in the direction of width are cut in a tapered form. To a base part of the contact 21, an L shaped bent piece 23 is continuous that has a width the same as that of the solder part 22. The L shaped bent piece 23 includes a horizontal part 23a and a vertical part 23b as a second engaging piece which form an angle of 90° to each other. The vertical part 23b functions as a below-described second engaging piece, and in both side edges thereof in the direction of width, engaging pawls 24 protrude which are engaged with below-described cut-out surfaces formed in the circuit board B. To an upper end of the vertical part 23b, one end of the solder part 22 is connected. The solder part 22 is extended horizontally in a plane parallel to the contact 21. Accordingly, the solder part 22 is located at a level higher by one stage than the contact 21 to maintain a parallel state to each other.

The solder part 22 includes a solder part main body 22a directly soldered to a pad part 26 on the circuit board B and a pendent part 22b as a first engaging piece connected to one side edge of an end of the solder part main body 22a in the direction of width. The pendent part 22b is continuous to the solder part main body 22a in the shape of L and serves as a below-described first engaging piece having a little resiliency. The pendent part 22b is extended to be pendent downward of the solder part main body 22a and has an end part (a lower end part) formed as a tapered part in which both side edges in the direction of width are cut in a tapered form. On an outer side surface of the pendent part 22b, an engaging pawl 25 protrudes which is embossed from an inner side surface to the outer side surface of the pendent part 22b. The engaging pawl 25 is formed in a triangular shape seen from a front surface, however, the engaging pawl 25 may be formed in a rectangular shape or in any of other shape.

On the other hand, on the circuit board B, a plurality of (three in FIG. 2) pad parts 26 are arranged in parallel. The pad parts 26 are formed by printing an electrically conductive material on an upper surface of an insulating board 27 to obtain, for instance, rectangular patterns. Although an illustration is omitted, on a front surface of the insulating board 27 or on a back surface through a through hole, a printing pattern of a prescribed circuit connected to the pad parts 26 is printed. The pad parts 26 are respectively arranged substantially at equal intervals at positions prescribed distance spaced from a front edge surface 27a of the insulating board 27. At positions of the front edge surface 27a of the insulating board 27 corresponding to the positions of the pad parts 26, substantially rectangular cut-out parts 28 are formed. The cut-out parts 28 have sizes and forms to which the vertical parts (the second engaging pieces) 23b of the L shaped bent pieces 23 can be pressed-in.

Further, on the insulating board 27, in the vicinity of the pad parts 26 respectively and in the vicinity of corner parts respectively opposite to the cut-out parts 28, engaging holes 29 which is thin and long forward and backward are provided. The engaging holes 29 have a length passing through the thickness of the insulating board 27. The engaging holes 29 have sizes and forms to which the pendent parts 22b of the solder part 22 can be pressed-in.

Now, a procedure for attaching the board connecting terminal A to the circuit board B to form the connector for connecting the board will be described below. Initially, the board connecting terminal A is allowed to face an upper part of any of the pad parts 26 on the insulating board 27. Further, the vertical part 23b forming the L shaped bent piece 23 of the board connecting terminal A and the pendent part 22b of the solder part 22 are respectively opposed to the cut-out part 28 and the engaging hole 29 of the insulating board 27 so as to be positioned thereto. Subsequently, the vertical part 23b is inserted into the cut-out part 28 and the pendent part 22b is inserted into the engaging hole 29. Then, after the inserting operation, the vertical part 23b is strongly pushed in (pressed-in) to the cut-out part 2 and the pendent part 22b is strongly pushed in (pressed-in) to the engaging hole 29.

Figure 7:
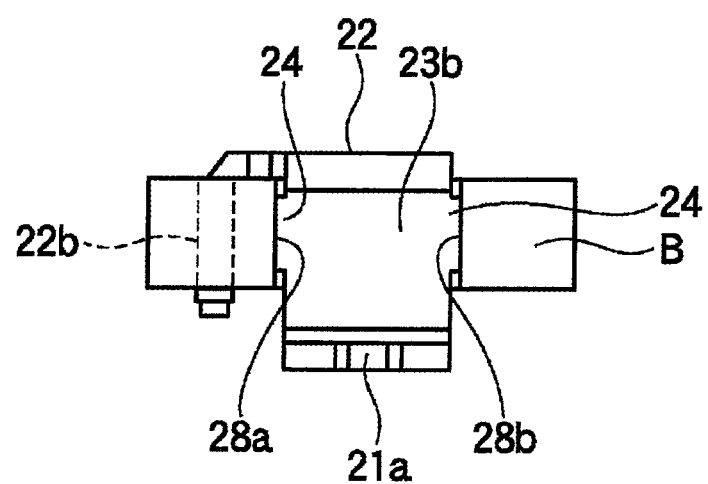
FIG. 7 is a side view showing an engaged state of a vertical part of the board connecting terminal and a cut-out part of a circuit board.

At this time, the engaging pawls 24 protruding in both the edges of the vertical part 23b are engaged with two opposed cut-out surfaces 28a and 28b in the cut-out part 28 so as to bite at them as shown in FIG. 7. Further, the engaging pawl 25 protruding in the outer side surface of the pendent part 22b is engaged with one inner side surface in the engaging hole 29 so as to bite at it. At this time, a back surface of the vertical part 23b is butted against a support surface 28c of the cut-out part 28.

The solder part main body 22 between the vertical part 23b and the pendent part 22b is previously bent so as to protrude toward the upper surface of the circuit board B. Accordingly, when the vertical part 23b and the pendent part 22b are respectively pressed-in to and held in the cut-out part 28 and the engaging hole 29, a lower surface of the solder part main body 22a does not float from the pad part 26 and comes into close contact with the pad part. Then, in the board connecting terminal A attached to the circuit board B by the above-described pressing-in operation, solder is applied to a peripheral area including an area where the pad part 26 is overlapped on the solder part main body 22a so that these areas are integrally connected together by the solder. In FIG. 1, the soldered parts are shown by chain lines K.

In this case, the vertical part (the second engaging piece) 23b connects the solder part main body 22a to the contact 21 so that the contact 21 is located at a position lower than that of the solder part main body 22a in the direction of thickness of the circuit board B and is engaged with the cut-out part 28 formed in an end part of the circuit board B as described above when the solder part main body 22a is soldered to the pad part 26. Accordingly, the vertical part 23b comes into contact with the cut-out surfaces of the cut-out part 28, and even when an external force in a direction for compressing (a pushing-in direction) the contact 21 is applied to the contact 21 during an attachment and detachment of the mate side connector, the vertical part 23b is supported by the support surface 28c between the cut-out surfaces 28a and 28b of the cut-out surfaces and does not collapse. Further, even when an external force in an opposite direction (a stretching direction) to the compressing direction is applied to the contact 21, since the engaging pawls 24 are engaged with the cut-out surfaces 28a and 28b of the cut-out part 28 so as to bite at them, the vertical part 23b does not fall down in the stretching direction.

Further, since a distance in which the contact 21 is separated from the solder part main body 22a in the direction of thickness of the circuit board B is set to a distance within the thickness of the circuit board B, the second engaging piece as the vertical part 23b assuredly faces the cut-out surfaces 28a and 28b and the support surface 28c of the cut-out part 28. Accordingly, when the contact 21 receives the external force exerted in the compressing direction during the attachment and detachment of the mate side connector, the vertical part 23b can be more assuredly avoided from collapsing in the cut-out part 28. Further, since the contact 21 can be slightly swung on the base part as a center, the contact can be easily connected to the terminal of the mate side connector.

Further, since the solder part main body 22a has a plate shaped form extending in the longitudinal direction of the contact 21, an area where the solder part main body 22a faces the pad part 26 can be sufficiently ensured. Accordingly, a solder bonding strength of the solder part main body 22a and the pad part 26 by soldering can be more improved. Further, the first engaging piece as the pendent part 22b and the second engaging piece as the vertical part 23b are respectively extended in end parts in the transverse direction of the solder part main body 22a having the plate shaped form.

Since the pendent part 22b and the vertical part 23b are respectively located in the engaging hole 29 and the cut-out part 28, the solder part main body 22a and the contact 21 can be assuredly avoided from moving in the direction along the surface of the of the circuit board B or shaking.

The board connecting terminal A having the above-described structure is attached to the circuit board B as described above to form the connector for connecting the board. Then, the mate side connector is connected to the connector for connecting the board and a female terminal of the mate side connector is connected to the contact 21, so that a circuit on the circuit board B can be electrically and mechanically connected to an external circuit. In the connector for connecting the board, even when the connector housing in the usual connector for connecting the board is not used, the vertical part 23b and the pendent part 22b are pressed-in to the cut-out part 28 and the engaging hole 29 so that the board connecting terminals may be substantially assuredly aligned and fixed. Therefore, since the connector housing is not used, an occupied space can be reduced and a cost can be decreased.

Further, in accordance with the structure that the vertical part 23b and the pendent part 22b are pressed-in to the cut-out part 28 and the engaging hole 29, when the terminal of the mate side connector is attached to and detached from the contact 21, an operating force (the external force) in an inserting direction or pulling direction of the terminal is applied to the contact 21. For the external forces, since the engaging pawls 24 protruding in the vertical part 23b of the L shaped bent piece 23 are engaged with the cut-out surfaces 28a and 28b of the cut-out part 28 of the circuit board B so as to bite at them and the engaging pawl 25 protruding in the pendent part 22b of the solder part 22 is engaged with the inner side surface of the engaging hole 29 in the circuit board B so as to bite at it, the vertical part 23b can be assuredly prevented from falling down in a forward and backward direction or a deformation such as a distortion of the vertical part can be assuredly prevented during the attachment and detachment of the mate side connector.

Figure 8A:
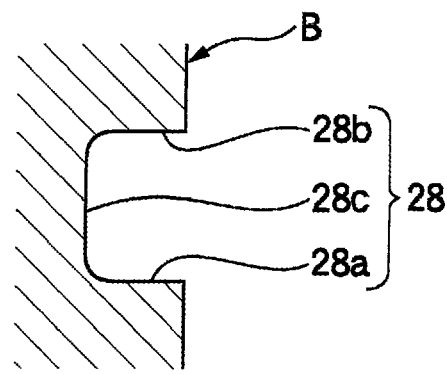
FIGS. 8A to 8C show plan views showing modified examples of the cut-out parts provided in the circuit board.
Figure 8B:
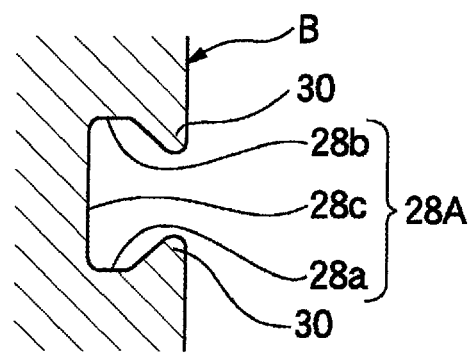
Figure 8C:
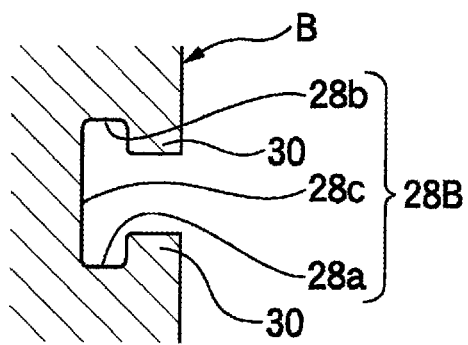

Especially, since the back surface of the vertical part 23b is supported by the support surface 28c of the cut-out part 28, even when the external force in the compressing direction (the pushing-in direction) is applied to the contact 21, the vertical part 23b is restrained from falling down in the pushing-in direction. Here, modified examples of forms of the cut-out part 28 are described below. FIG. 8A shows the above-described cut-out part 28 having a rectangular form seen from an upper part. FIGS. 8B and 8C show cut-out parts 28A and 28B having a wedge form or a dovetail groove form which are different from the cut-out part 28 shown in FIG. 8A. The cut-out parts 28A and 28B have protruding edges 30 formed which support front surfaces of both ends of the vertical part 23b. Thus, even when an external force in a pulling direction is applied to the contact 21 during the attachment and detachment of the mate side connector, the vertical part 23b can be assuredly prevented from being deformed so as to fall down in the pulling direction (the stretching direction) in the cut-out parts 28A and 28B.

Also in this case, since the engaging pawls 24 provided in both the ends of the vertical part 23b in the direction of width are butted against cut-out surfaces 28a and 28b in the cut-out parts 28A and 28B so as to bite at them, even when the vertical part 23b receives an external force in the direction of width as well as the external force in the pushing-in direction or in the pulling direction, the vertical part 23b does not move outside from the cut-out parts 28A and 28B, nor does shake as described above.

Figure 9:
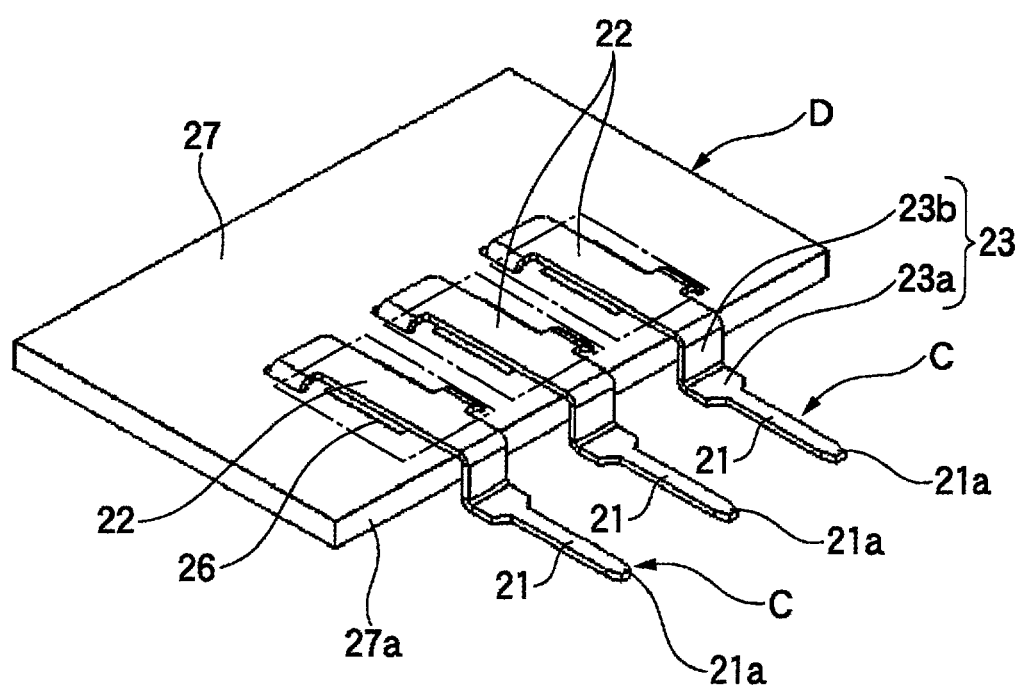
FIG. 9 is s a perspective view showing a connector for connecting a board having a board connecting terminal according to another exemplary embodiment of the present invention.
Figure 10:
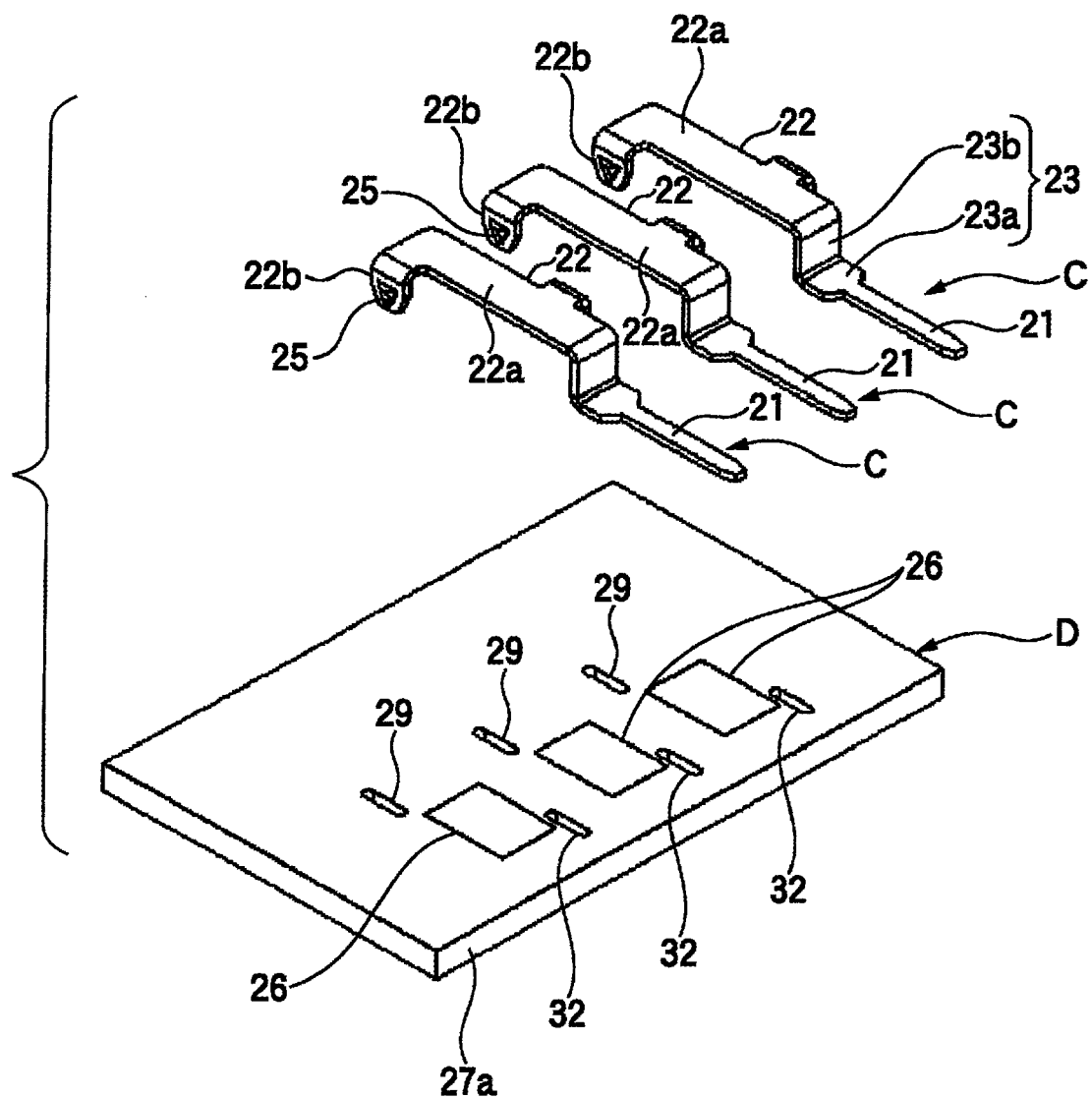
FIG. 10 is an exploded perspective view of the connector for connecting the board shown in FIG. 9.
Figure 11:
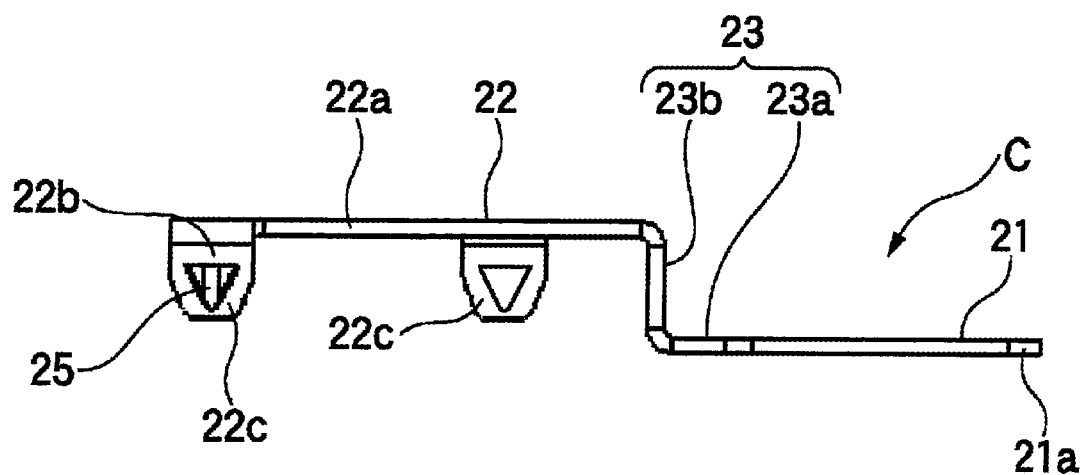
FIG. 11 is a front view showing the board connecting terminal shown in FIG. 10.
Figure 12:
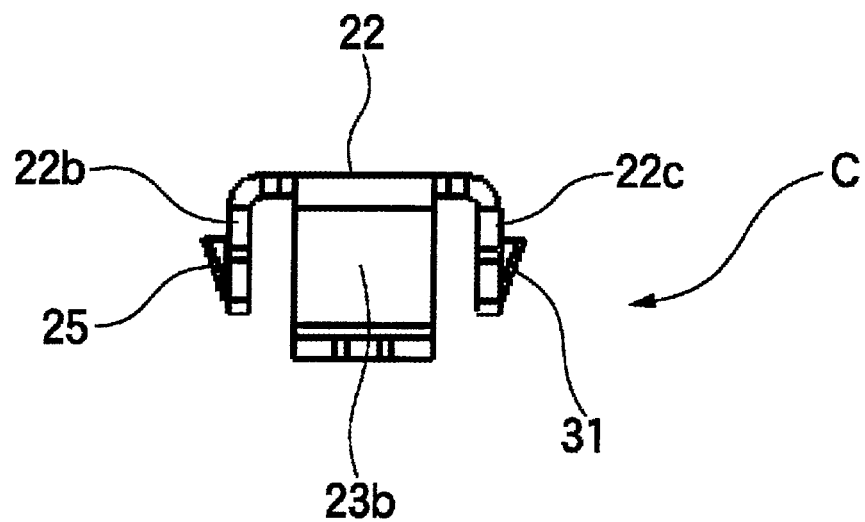
FIG. 12 is a right side view showing the board connecting terminal shown in FIG. 10.
Figure 13:
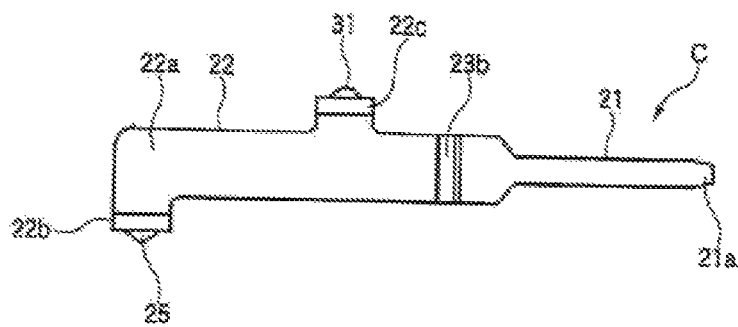
FIG. 13 is a plan view showing the board connecting terminal shown in FIG. 10.
Figure 14:
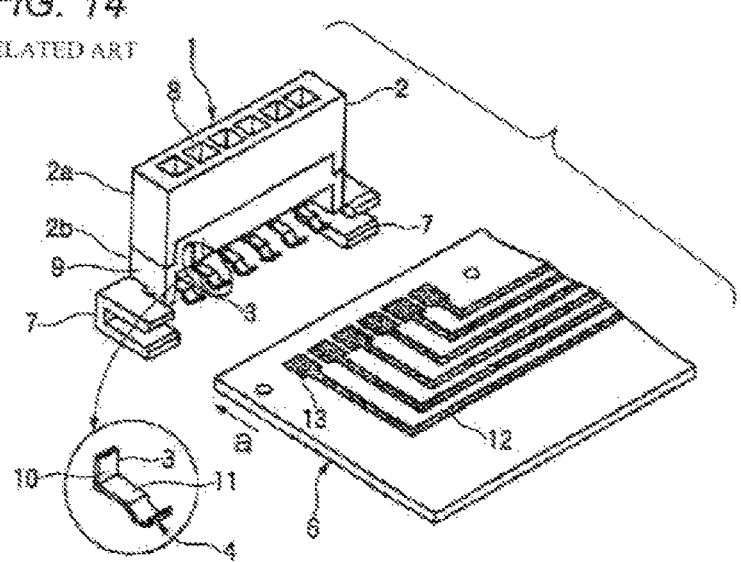
FIG. 14 is an exploded perspective view showing a usual connector for connecting a board.

FIG. 9 to FIG. 13 show another exemplary embodiment of a board connecting terminal according to the present invention. The board connecting terminal C of this exemplary embodiment is attached to a circuit board D as shown in FIG. 9 and FIG. 10 to form a connector for connecting a board. Here, the board connecting terminal C has a form as shown in FIG. 11 to FIG. 13. The board connecting terminals C is different from the board connecting terminal A shown in FIG. 1 to FIG. 7 in view of below-described points. Namely, a pendent part 22c is formed in one side edge of the solder part 22 in the direction of width, that is, a side edge opposite to a side in which the pendent part 22b is provided and at a position near the L shaped bent piece 23. The size or the form of the pendent part 22c is substantially the same as that of the pendent part 22b. In the pendent part 22c, an engaging pawl 31 protrudes which is embossed from an inner side to an outer side thereof by a press. Since other structures are the same as those of the board connecting terminal A shown in FIG. 1 to FIG. 7, a duplicated explanation is omitted.

On the other hand, in the circuit board D, at a position corresponding to the pendent part 22c of the board connecting terminal C, an engaging hole 32 is provided as shown FIG. 9 and FIG. 10. The size or the form of the engaging hole 32 are substantially the same as that of the engaging hole 29 and the engaging hole 32 is located on a line connected to the engaging hole 29 with a pad part 26 sandwiched between them. In the circuit board D, the cut-out part 28 provided in the circuit board B is not provided.

The board connecting terminal C according to a second exemplary embodiment is attached to the circuit board D as shown in FIG. 9. When the board connecting terminal C is attached to the circuit board D, the pendent part 22b and the pendent part 22c are respectively inserted into and pressed-in to the engaging hole 29 and the engaging hole 32 of the circuit board D. Then, by the pressing-in operation, the engaging pawl 25 of the pendent part 22b is engaged with the inner side surface of the engaging hole 29 so as to bite at it. On the other hand, the engaging pawl 31 is engaged with an inner side surface of the engaging hole 32 so as to bite at it. Further, a back surface (an inner side surface) of the vertical part 23b of the L shaped bent piece 23 is allowed to abut on one front edge surface 27a of the circuit board D.

In the board connecting terminal C, when a female terminal of a mate side connector is attached to or detached from a contact 21, an external force in a compressing direction or a stretching direction is applied to the contact 21. The vertical part 23b of the L shaped bent piece 23 which receives the external force is liable to move along the front edge surface 27a of the circuit board D or shake as described above. However, the pendent part 22b and the pendent part 22c of the board connecting terminal C are respectively pressed-in to the engaging holes 29 and 32 and the engaging pawls 25 and 31 are respectively engaged with the inner side surfaces of the engaging holes 29 and 32 so as to bite them. Therefore, even when the external force is applied to the contact, the vertical part 23b does not fall down, nor is distorted. In this exemplary embodiment, while the connector housing is saved, a size can be made to be compact and a cost can be decreased as the connector for connecting the board. Even when the contact 21 receives the external force during the attachment and detachment of the mate side connector, the contact 21 is not deformed, nor is moved. The board connecting terminals C are soldered to the pad parts 26 of the circuit board D, so that the board connecting terminals C can be assuredly aligned and fixed on the circuit board D.

As described above, the board connecting terminal C has the solder part 22 connected to the contact 21 and soldered to the pad part 26 formed on the circuit board D. The solder part 22 includes a solder part main body 22a soldered to the pad part 26, the pendent part 22b extended from the solder part main body 22a and the vertical part 23b extended from the solder part main body 22a. Under a state that the pendent part 22b and the vertical part 23b are engaged with the circuit board D, the solder part main body 22a is soldered to the pad part 26.

Thus, while an installation of the connector housing is saved, the board connecting terminal including the contact 21 is not deformed, nor is moved relative to the external force during the attachment and detachment of the mate side connector, the board connecting terminals can be aligned and fixed in the normal positions of prescribed positions on the circuit board and a mechanical and electrical connection of the circuits can be sufficiently assuredly realized by a solder connection.

INDUSTRIAL APPLICABILITY

According to the board connecting terminal of the present invention, since the use of the connector housing for aligning and holding the terminals is saved, a size can be made to be compact and the cost can be decreased as the connector for connecting the board, the contacts are not deformed, nor the contacts are moved by receiving the external force during the attachment and detachment of the mate side connector and the board connecting terminals can be aligned and fixed so as to face parts just above the pad parts on the circuit board.

REFERENCE SIGNS LIST

A . . . board connecting terminal
B . . . circuit board
21 . . . contact
21a . . . end part
22 . . . solder part
22a . . . solder part main body
22b . . . pendent part (first engaging piece)
22c . . . pendent part
23 . . . L shaped bent piece
23a . . . horizontal part
23b . . . vertical part (second engaging piece)
24, 25 . . . engaging pawl
26 . . . pad part
27 . . . insulating board
27a . . . front edge surface
28, 28A, 28B . . . cut-out part
28a, 28b . . . cut-out surface
28c . . . support surface
29, 32 . . . engaging hole
30 . . . protruding edge
31 . . . engaging pawl

What is claimed is:

1. A board connecting terminal comprising:
a contact which comes into contact with a mate side terminal; and
a solder part soldered to a pad part formed in a circuit board and connected to the contact,
wherein the solder part includes a solder part main body soldered to the pad part, a first engaging piece extended from the solder part main body and bent downward and a second engaging piece extended from the solder part main body and bent downward,
the solder part main body is soldered to the pad part under a state that the first engaging piece and the second engaging piece are engaged with the circuit board, the first engaging piece is engaged with an engaging hole bored on a surface of the circuit board on which the pad part is formed and the second engaging piece is engaged with a cut-out part formed in an end part of the circuit board, the first engaging piece includes a first engaging pawl to be engaged with an inner face of the engaging hole and the second engaging piece includes a second engaging pawl to be engaged to a face of the cut-out part.

2. The board connecting terminal according to claim 1, wherein one of the first and second engaging pieces extends along an open ended cutout defined along one side of the circuit board.

3. The board connecting terminal according to claim 2, wherein the other of the first and second engaging pieces defines a pawl that is configured to communicate with an inner side surface of a hole defined in the circuit board.

4. The board connecting terminal according to claim 1, wherein the solder part main body is located so as to be sandwiched between the first engaging piece and the second engaging piece and is bent so as to protrude to the circuit board.

5. The board connecting terminal according to claim 1, wherein the first engaging piece is parallel with a first side edge of the circuit board and the second engaging niece is parallel with a second side edge of the circuit board, the directions of elongation of the first and second engaging pieces being orthogonal relative to each other.

6. The board connecting terminal according to claim 5, wherein the directions of elongation of the first and second engaging pieces are perpendicular relative to each other.

* * * * *